(12) United States Patent
Yamauchi et al.

(10) Patent No.: US 6,472,917 B2
(45) Date of Patent: *Oct. 29, 2002

(54) SEMICONDUCTOR INTEGRATED CIRCUIT DEVICE HAVING COMPENSATION FOR WIRING DISTANCE DELAYS

(75) Inventors: Tatsumi Yamauchi, Hitachiohta; Kazuharu Kuchimachi, Hadano, both of (JP)

(73) Assignee: Hitachi, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/381,170
(22) PCT Filed: Mar. 19, 1997
(86) PCT No.: PCT/JP97/00904
  § 371 (c)(1),
  (2), (4) Date: Sep. 17, 1999
(87) PCT Pub. No.: WO98/42021
  PCT Pub. Date: Sep. 24, 1998

(65) Prior Publication Data
  US 2002/0005742 A1 Jan. 17, 2002

(51) Int. Cl.[7] .................................................. H03K 5/12
(52) U.S. Cl. ............................. 327/170; 326/87; 326/98
(58) Field of Search ........................ 327/170; 326/87, 326/98

(56) References Cited

U.S. PATENT DOCUMENTS

| 4,731,553 A | * | 3/1988 | Van Lehn et al. ............. 327/87 |
| 4,779,013 A | * | 10/1988 | Tanaka ........................ 326/87 |
| 4,973,865 A | * | 11/1990 | Haq ........................... 327/263 |
| 5,057,711 A | * | 10/1991 | Lee et al. .................... 326/87 |
| 5,191,245 A | * | 3/1993 | Kang ......................... 327/170 |
| 5,237,213 A | * | 8/1993 | Tanoi ........................ 327/205 |
| 5,410,189 A | * | 4/1995 | Nguyen ...................... 327/170 |
| 5,572,151 A | * | 11/1996 | Hanawa et al. .............. 326/113 |
| 5,654,981 A | * | 8/1997 | Mahant-Shetti et al. ...... 326/83 |
| 5,894,238 A | * | 4/1999 | Chien ........................ 326/87 |
| 6,046,621 A | * | 4/2000 | Crowley ..................... 326/87 |

FOREIGN PATENT DOCUMENTS

| JP | 61-163414 | 7/1986 |
| JP | 63-42216 | 2/1988 |
| JP | 2-165724 | 6/1990 |
| JP | 4-23347 | 1/1992 |
| JP | 4-246913 | 9/1992 |
| JP | 8-8725 | 1/1996 |

* cited by examiner

*Primary Examiner*—Terry D. Cunningham
(74) *Attorney, Agent, or Firm*—Mattingly, Stanger & Malur, P.C.

(57) ABSTRACT

A third gate circuit which is controlled by a clock signal and operates upon the detection of change of a signal on a critical path driven by a first gate circuit and transmits a signal provided by the first gate circuit to a second gate circuit is connected to the critical path at a position near the second gate circuit. The third gate circuits operates upon the detection of change of the signal to increase the speed of change of the signal. Thus, the ratio of a delay time attributable to wiring resistance in the critical path of a semiconductor integrated circuit is reduced, the speed of the critical path is increased and the operating frequency of the semiconductor integrated circuit can be improved.

16 Claims, 5 Drawing Sheets

SEMICONDUCTOR INTEGRATED CIRCUIT DEVICE HAVING COMPENSATION FOR WIRING DISTANCE DELAYS

TECHNICAL FIELD

The present invention relates to a semiconductor integrated circuit device having a large chip size that is provided with miniaturized wiring lines and more particularly, to a circuit configuration suitable for reducing wiring delay.

BACKGROUND ART

Conventional methods of increasing the speed of critical paths in a semiconductor integrated circuit include (A) reducing the basic delay time of gate circuits, (B) increasing the load driving force of gate circuits and (C) distributing output load by multiplexing gate circuits.

A precharge circuit is effective in the methods (A) and (B). An output node in a precharge circuit is precharged, and the precharge circuit is driven by a transistor having a low output impedance.

Although these speed increasing methods are effective on capacity load, the effect of these speed increasing methods are not as effective as expected on resistance load, such as the resistance of wiring lines.

In a conventional semiconductor integrated circuit, wiring resistance is low as compared with the on-resistance of a load driving transistor of the gate circuit. Therefore, the speed of the critical path can be increased by the speed increasing method effective in capacity load.

However, since the semiconductor integrated circuit has some long wiring lines, the necessity of increasing the speed of the long wiring lines has been understood. It has been proposed to increase the speed of long wiring lines by providing the long wiring lines with a relay buffer as mentioned in JP-A No. Hei 4-23347. The foregoing method of increasing the speed is effective when the ratio of wiring delay in the critical path is small as compared with a delay time taken by the gate circuit. However, the effect of the increase of speed decreases when the ratio of wiring delay is increased due to the enlargement of the semiconductor integrated circuit and the miniaturization of the wiring lines.

It is mentioned in connection with the effect of wiring delay in "Design of high-speed LSI", Nikkei Electronics, No. 13, pp. 177–183, Special Edition, (March, 1995) that the ratio of wiring delay increases beyond 50% when the operating frequency exceeds 100 MHz and design rules are 0.35 µm.

Problems relating to wiring delay are contradictory to the miniaturization of semiconductor integrated circuits and the importance thereof will progressively increase in the future. At the present, the reduction of wiring delay, similarly to the increase of the speed of gate circuits, is an important problem in increasing the speed of critical paths.

A conventional method which inserts a relay buffer into a long wiring line needs inverters arranged in two stages to match the polarities of signals and is not effectively applicable to all cases for speed increase.

Accordingly, it is an object of the present invention to reduce the ratio of delay time caused by wiring resistance in a critical path included in a semiconductor integrated circuit, to increase the speed of the critical path and to improve the operating frequency of the semiconductor integrated circuit. Another object of the present invention is to increase long wiring driving speed, the distribution of noise sources by distributing long wiring line driving circuits, and to prevent the reduction of reliability due to electromigration.

DISCLOSURE OF THE INVENTION

According to the present invention, a semiconductor integrated circuit device comprises a first gate circuit, and a second gate circuit that receives an output signal provided by the first gate circuit and provides a signal to the following circuit, wherein a third gate circuit for increasing the changing speed of the output signal of the first gate circuits connected to a wiring line interconnecting the first and the second gate circuits at a position near the second gate circuit.

In this semiconductor integrated circuit device, the ratio of wiring delay due to wiring resistance in a critical path included in the semiconductor integrated circuit device is reduced and, consequently, the speed of the critical path can be increased and the operating frequency of the semiconductor integrated circuit can be improved.

BEST MODE FOR CARRYING OUT THE INVENTION

Figure 1:
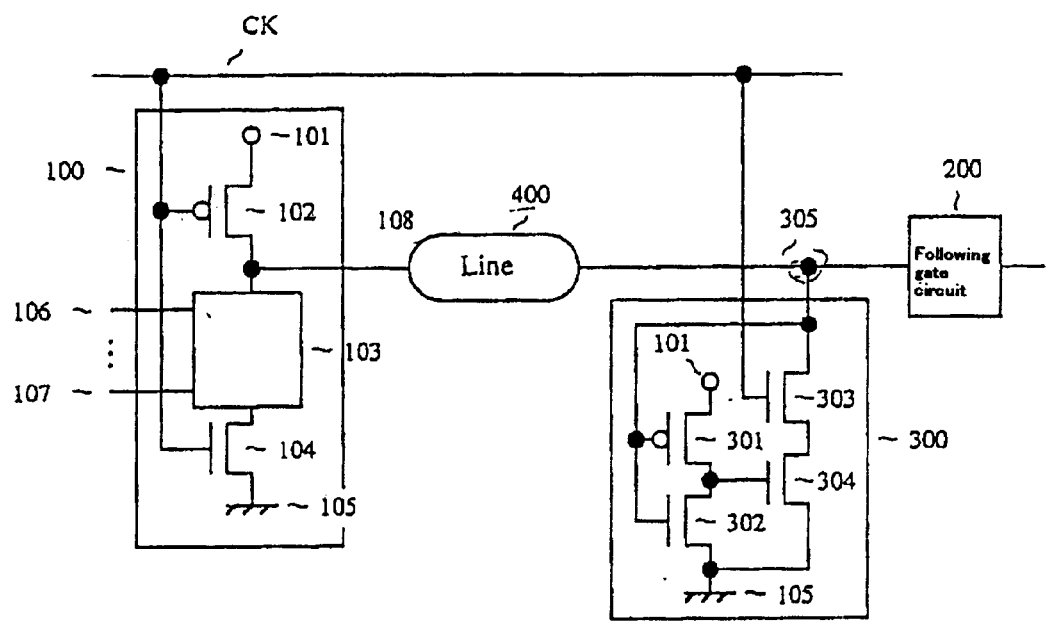
FIG. 1 is a circuit diagram of a semiconductor integrated circuit device in a first embodiment according to the present invention.

Preferred embodiments of the present invention will be described with reference to the accompanying drawings, in which like or corresponding parts are designated by the same reference characters.

FIG. 1 shows a first embodiment of the present invention. Shown in FIG. 1 are a clock signal CK, a precharge circuit 100, a gate circuit 200, a speed increasing circuit 300, and a long line 400.

The precharge circuit 100 comprises a power supply terminal 101, a PMOSFET 102, a logic circuit 103 comprising NMOSFETs, an NMOSFET 104 and a grounding terminal 105. While the clock signal CK is LOW, the PMOSFET 102 is closed and the output 108 of the precharge circuit 100 is precharged to HIGH. While the clock signal CK is HIGH, NMOSFETs are closed and the NMOS logic circuit 103 receives input signals 106 to 107 and operates to maintain an output signal 108 HIGH or at a ground potential.

The speed increasing circuit 300 comprises a power supply terminal 101, a PMOSFET 301, NMOSFETs 302, 303 and 304, and a grounding terminal 105. While the clock signal CK is LOW, the NMOSFET 303 is open and a signal 305 is on a level equal to that of an output signal provided by the precharge circuit 100. While the clock signal CK is HIGH, the output of an inverter formed of the PMOSFET 301 and the NMOSFET 302 goes LOW if the signal 305 is HIGH, and the output signal of the precharge circuit 100 is transferred directly to the signal 305. When the clock signal CK is HIGH and the signal 305 is LOW, an output of an inverter formed of the PMOSFET 301 and the NMOSFET 302 goes HIGH and, consequently, the NMOSFETs 303 and 304 close simultaneously to make the signal 305 go LOW.

While the clock signal CK is LOW, the output 109 of the precharge circuit 100 remains HIGH, and the output signal 108 of the precharge circuit 100 is transferred through the line 400 to the signal 305. The speed increasing circuit 300 does not affect the signal 305 because the NMOSFET 303 is open. The NMOSFET 303 remains open to avoid conflict between the precharge circuit 100 and the speed increasing circuit 300 in a precharging period in which the precharge circuit 1100 executes a precharging operation, i.e., in which the signal 305 changes from LOW to HIGH.

While the clock signal CK is HIGH, the output signal 108 of the precharge circuit 100 varies according to the input signals 106 to 107. Suppose that the level of the output signal 108 is changed to LOW. Then, the change of the output signal 108 is transferred through the line 400 to the signal 305. When the output signal 305 starts changing from HIGH to LOW, the output of the inverter formed of the PMOSFET 301 and the NMOSFET 302 of the speed increasing circuit 300 changes from LOW to HIGH and, consequently, both the NMOSFETs 303 and 304 close to change the level of the signal 305 quickly to LOW.

The reaction speed of the speed increasing circuit 300 is greatly dependent on the logical threshold of the inverter formed of the PMOSFET 301 and the NMOSFET 302. The reaction speed is high when the logical threshold is high. Practically, it is preferable that the logical threshold is raised to an extent which will not be affected by noise generated by a power supply and the signal line 305.

In this embodiment, when the driving circuit comprising the precharge circuit, and the next gate circuit are separated by a distance exceeding a fixed distance, the precharge circuit is able to achieve an operation to change to LOW at a high speed when the speed increasing circuit is disposed near the next gate circuit.

When the precharge circuit needs to drive a large capacity load, noise sources can be dispersed and the design of power lines subject to restrictions by electromigration can be facilitated because drivers can be distributed (the speed increasing circuit takes part of the load driving).

Figure 2:
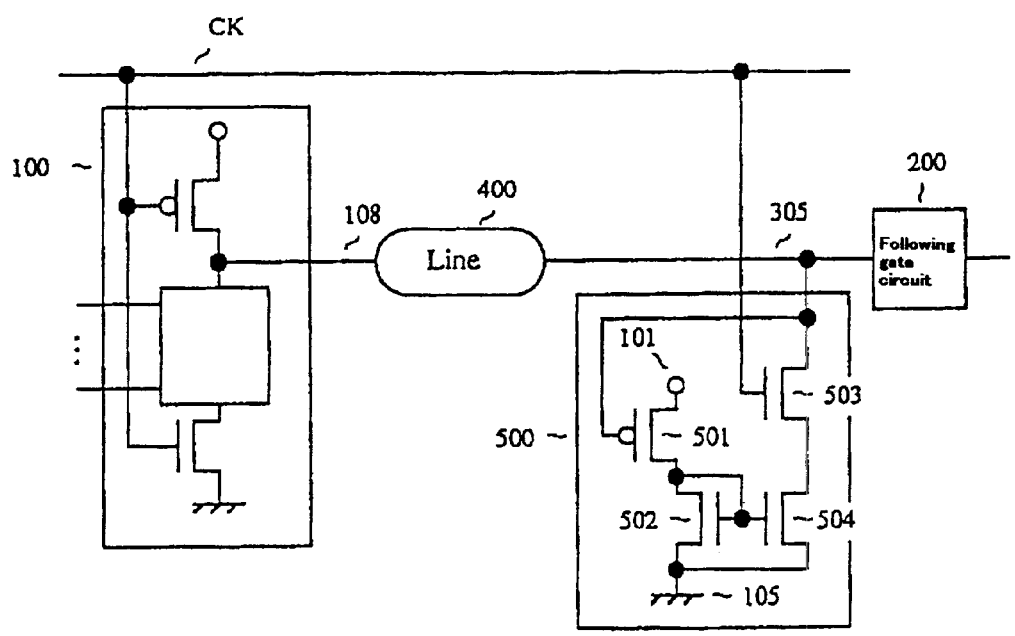
FIG. 2 is a circuit diagram of a semiconductor integrated circuit device in a second embodiment according to the present invention.

FIG. 2 shows a second embodiment of the present invention. The second embodiment differs from the first embodiment shown in FIG. 1 only in the configuration of a speed increasing circuit 500. The speed increasing circuit 500 comprises a PMOSFET 501 and NMOSFETs 502, 503 and 504. The PMOSFET 501 and the NMOSFET 502 form an inverter, and the NMOSFETs 502 and 504 are connected so as to form a current mirror circuit.

The embodiment shown in FIG. 2 is the same in function and effects as the first embodiment shown in FIG. 1.

Figure 3:
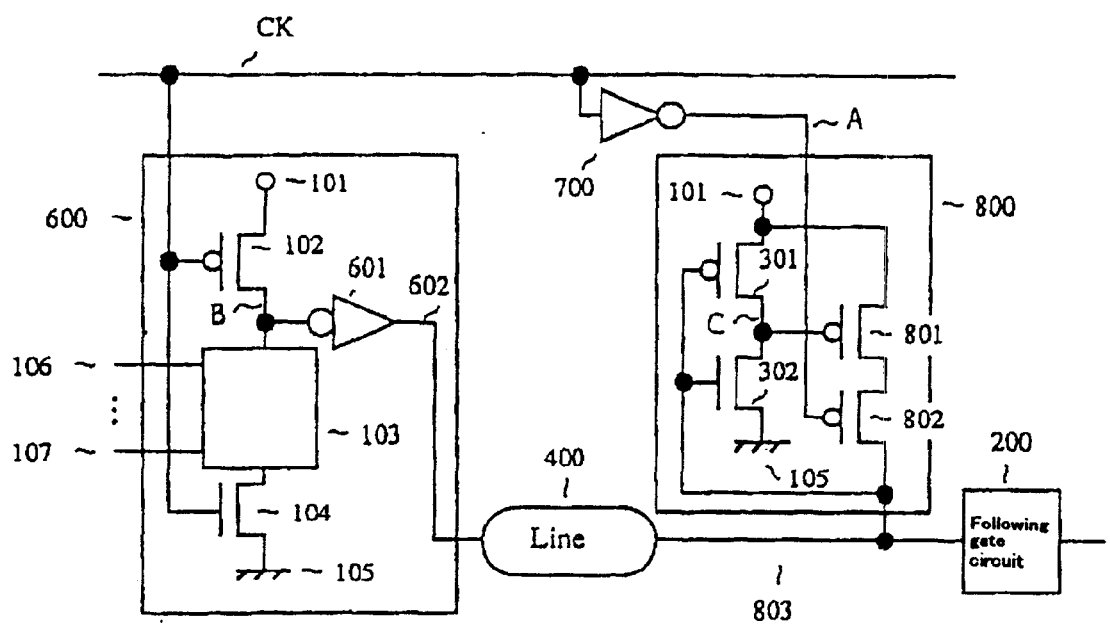
FIG. 3 is a circuit diagram of a semiconductor integrated circuit device in a third embodiment according to the present invention.

FIG. 3 shows a third embodiment of the present invention. In FIG. 3, indicated at 600 is a precharge circuit. The precharge circuit 600 is constructed by additionally connecting an inverter 601 to the output of the precharge circuit 100 shown in FIG. 1. Therefore, an output signal 602 is LOW during a precharging period in which the clock signal CK is LOW.

An inverter 700 supplies an inverted signal obtained by inverting the clock signal CK to a speed increasing circuit 800. The speed increasing circuit 800 differs from the speed increasing circuit 300 shown in FIG. 1 in that an output of an inverter formed of a PMOSFET 301 and an NMOSFET 302 is applied to a PMOSFET 801, and a PMOSFET 802 having a gate controlled by the inverter 700 is interposed between the PMOSFET 801 and a signal 803.

Figure 8:
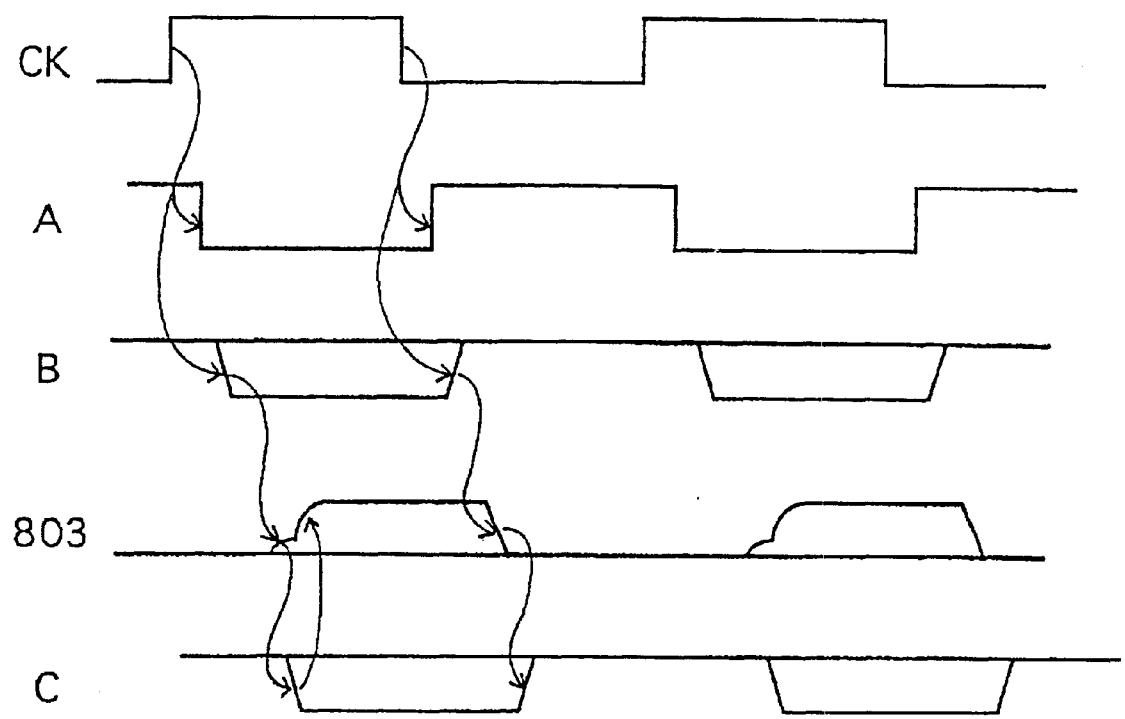
FIG. 8 is a time chart of assistance in explaining the operation of the semiconductor integrated circuit device in the third embodiment shown in FIG. 3.

In the third embodiment shown in FIG. 3, the speed of change from LOW to HIGH of an output signal 602 of the precharge circuit 600 and the signal 803 on a line 400 can be increased. FIG. 8 is a time chart of assistance in explaining the operation of the semiconductor integrated circuit device shown in FIG. 3.

The third embodiment is the same in effect in distributing noise sources and electromigration as the first embodiment shown in FIG. 1.

Figure 4:
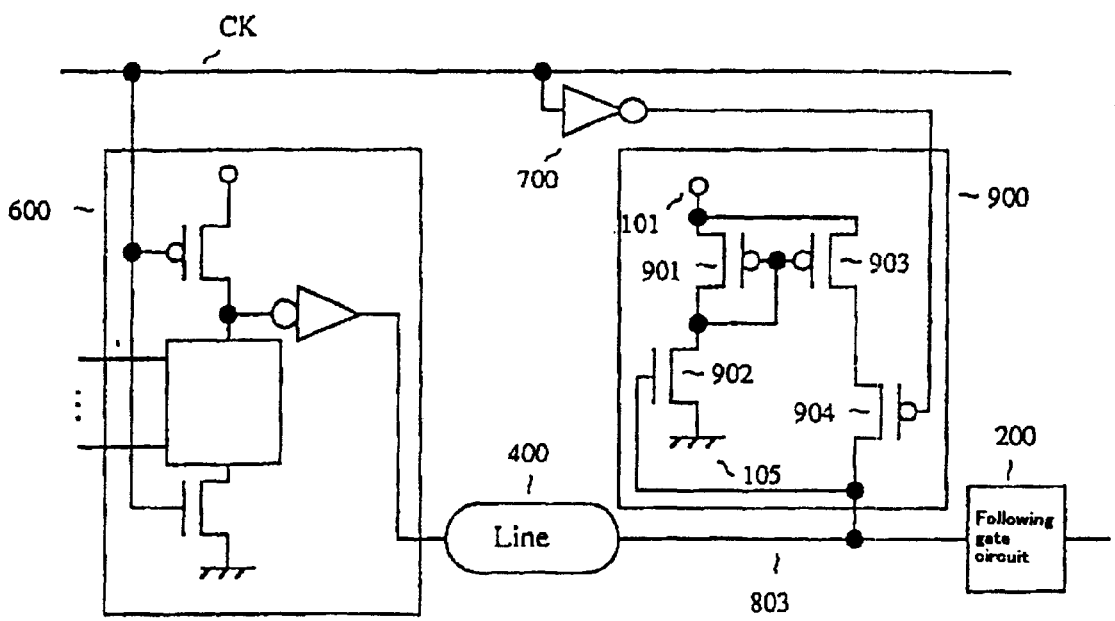
FIG. 4 is a circuit diagram of a semiconductor integrated circuit device in a fourth embodiment according to the present invention.

FIG. 4 shows a fourth embodiment. The fourth embodiment differs from the third embodiment shown in FIG. 3 in the configuration of a speed increasing circuit 900. The speed increasing circuit 900 comprises PMOSFETs 901, 903 and 904, and an NMOSFET 902. The PMOSFET 901 and the NMOSFET 902 form an inverter, and the PMOSFETs 901 and 903 are connected so as to form a current mirror circuit.

The fourth embodiment shown in FIG. 4 is the same in function and effect as the third embodiment shown in FIG. 3.

Figure 5:
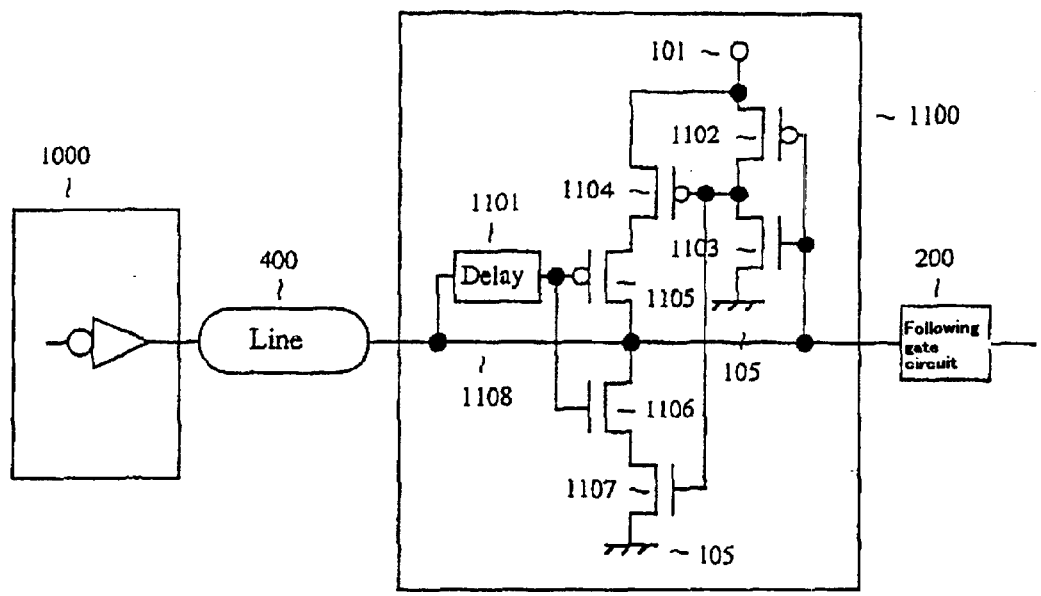
FIG. 5 is a circuit diagram of a semiconductor integrated circuit device in a fifth embodiment according to the present invention.

FIG. 5 shows a fifth embodiment of the present invention. In FIG. 5, indicated at 1000 is a driving circuit comprising a precharge circuit or a static circuit, and at 1100 is a speed increasing circuit. The speed increasing circuit 1100 comprises a delay circuit 1101, PMOSFETs 1102, 1104 and 1105, and NMOSFETs 1103, 1106 and 1107. An output provided by an inverter formed of the PMOSFET 1102 and the NMOSFET 1103 is given to the PMOSFET 1104 and the NMOSFET 1107. The PMOSFETs 1104 and 1105 increases the speed of change of a signal 1108 from LOW to HIGH. The NMOSFETs 1106 and 1107 increases the speed of change of the signal 1108 from HIGH to LOW.

The delay circuit 1101 executes an operation to prevent conflict between the driving circuit 1000 and the speed increasing circuit 1100. The functions of the delay circuit 1101 are the same as those of the clock signals CK used in the semiconductor integrated circuit devices shown in FIGS. 1 to 4.

Suppose that the signal 1108 and the output of the delay circuit 1101 are LOW. When the signal 1108 changes from LOW to HIGH, the PMOSFETs 1104 and 1105 make the signal 1108 go HIGH at a high speed. Since the output signal of the delay circuit 1101 goes HIGH after the elapse of a fixed time, the PMOSFET 1105 opens to stop the function of the speed increasing circuit 1100. The output signal of the delay circuit 1101 is LOW in a period in which the signal 1108 changes from LOW to HIGH. Therefore, any current does not flow through the NMOSFETs 1106 and 1107.

When the signal 1108 changes from HIGH to LOW, the inverter formed of the PMOSFET 1102 and the NMOSFET 1103 reacts to the change of the signal 1108 because the PMOSFET 1105 is open and the NMOSFET 1106 is closed. When the output signal of the inverter starts changing to HIGH, the signal 1108 is changed quickly to LOW through the NMOSFETs 1106 and 1107.

In this embodiment, the control signal of the speed increasing circuit 1100 is self-generated by the delay circuit 1101. The speed increasing circuit may be controlled by a clock signal generated by shifting the phase of the clock signal for controlling the driver.

The fifth embodiment is capable of increasing the speed of signal change even if the driving circuit is either a precharge circuit or a static circuit. The fifth embodiment is capable of quickly achieving both the change of the signal from LOW to HIGH and the change of the same from HIGH to LOW.

The effect of the fifth embodiment in distributing noise sources and electromigration is the same as that of the first embodiment shown in FIG. 1.

Figure 6:
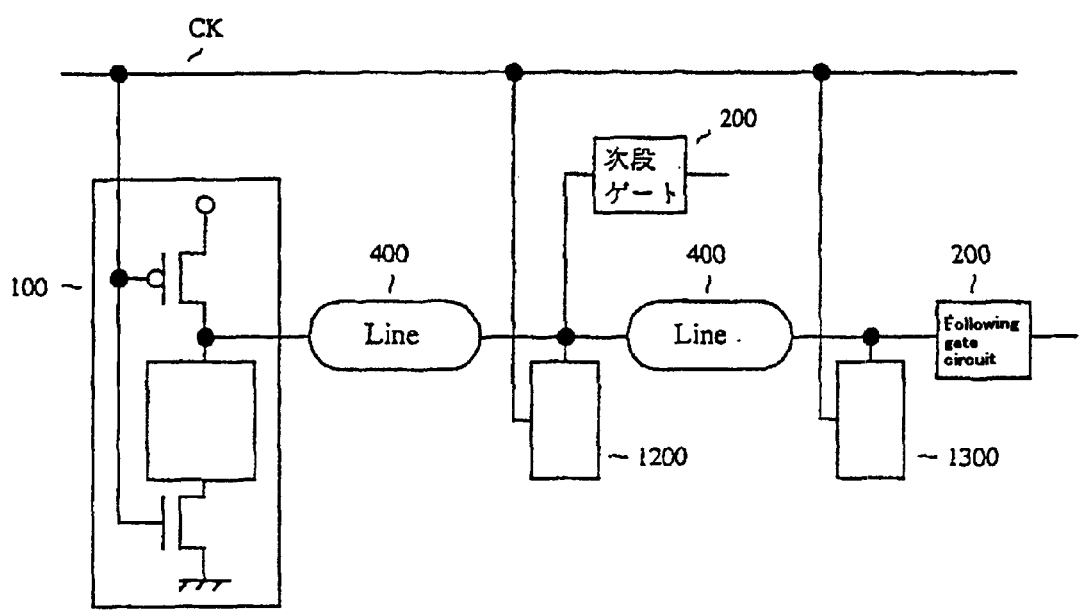
FIG. 6 is a circuit diagram of a semiconductor integrated circuit device in a sixth embodiment according to the present invention.

FIG. 6 shows a sixth embodiment of the present invention. The sixth embodiment is an application of the present invention to a device provided with a plurality of following gates 200 connected in series. In FIG. 6, indicated at 1200 land 1300 are speed increasing circuits similar to the foregoing speed increasing circuits. The sixth embodiment is characterized by the plurality of speed increasing circuits connected to lines connecting a driving circuit 100 to the following gate circuits. Thus, a signal can be transferred from the driving circuit 100 to the following gate circuit 200 at a further increased speed.

The sixth embodiment is shown in a configuration for achieving a change to LOW at a high speed. The driving circuit and the speed increasing circuit may properly be combined to achieve a change to HIGH at a high speed or to achieve changes from LOW to HIGH and vice versa.

Figure 7:
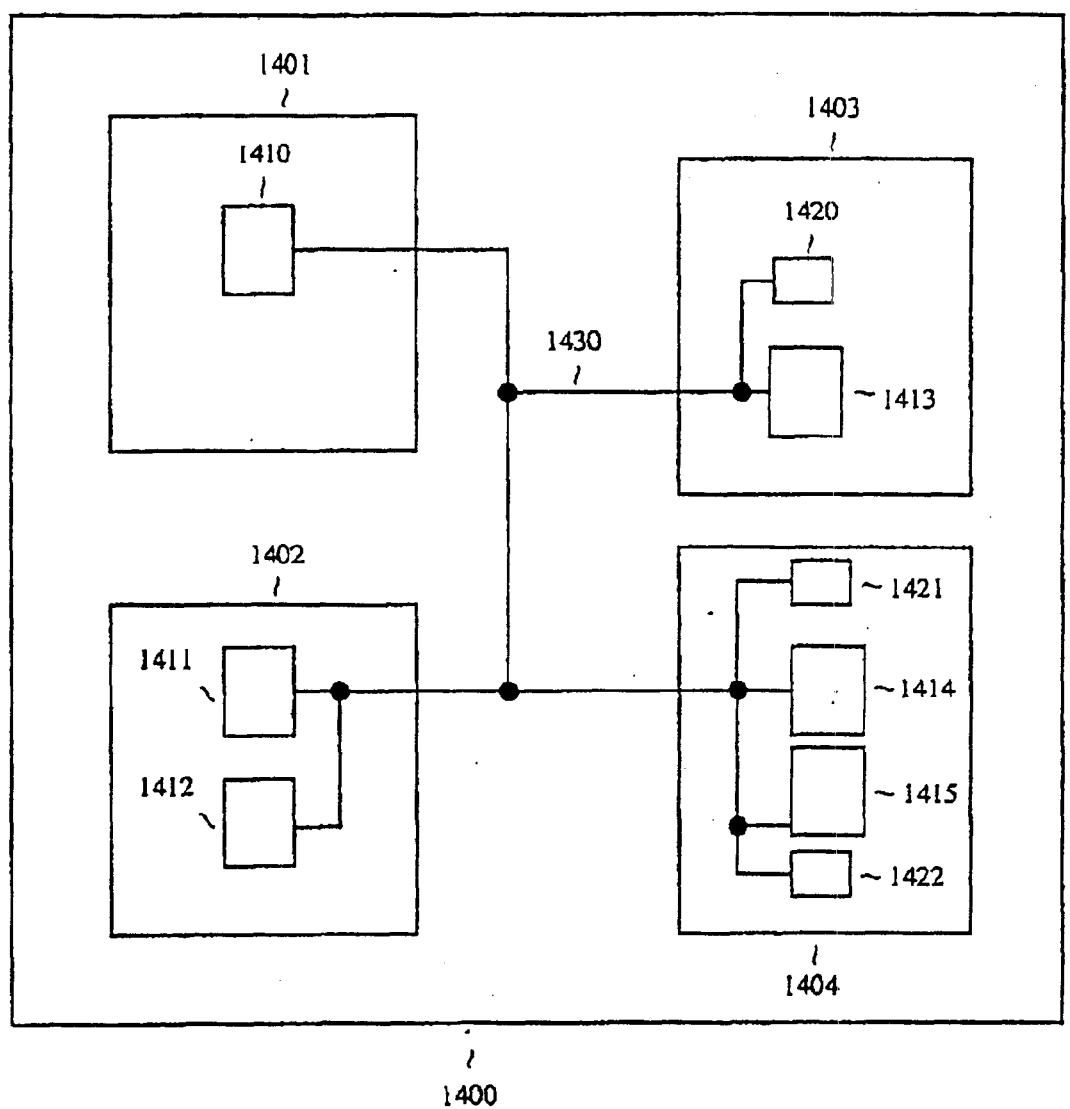
FIG. 7 is a circuit diagram of a semiconductor integrated circuit device in a seventh embodiment according to the present invention.

FIG. 7 shows seventh embodiment of the present invention, In FIG. 7, indicated at 1400 is a semiconductor integrated circuit device, and at 1401 to 1404 are logical blocks. Driving circuits 1410 to 1412 drive a signal line 1430. The driving circuits 1410 to 1412 are controlled by a clock signal supplied to a semiconductor integrated circuit. In FIG. 7, indicated at d1413 to 1415 are following gate circuits and at 1420 to 1422 are speed increasing circuits in accordance with the present invention.

The seventh embodiment has the signal line 1430 extended all over the semiconductor integrated circuit, and is provided with the plurality of driving circuits for driving the signal line 1430, and the plurality of following gate circuits. Therefore, high-speed signal transfer can be achieved by connecting the plurality of speed increasing circuits to the signal line 1430.

The seventh embodiment is capable of increasing signal transfer speed more effectively than a device in which an intermediate buffer is connected to the signal line 1430, and of increasing signal transfer speed regardless of the polarity, i.e., positive polarity or negative polarity, of the signal line.

CAPABILITY OF EXPLOITATION IN INDUSTRY

As apparent from the foregoing description, the present invention is suitable for application to a semiconductor integrated circuit device having a large chip size and provided with miniaturized wiring lines.

What is claimed is:

1. A semiconductor integrated circuit device comprising:
a first driving circuit comprising a precharge circuit that is controlled by a first clock signal;
a next gate circuit that receives an output signal provided by the first driving circuit through a transmission line; and
a speed increasing circuit that is controlled by a second clock signal, that detects the change of the output signal of the first driving circuit, that increases the speed of changing the output signal of the first driving circuit and that is connected to the transmission line connecting the next gate circuit to the first driving circuit at a connecting position of the transmission line, wherein a line length between the connecting point and the next gate circuit is shorter than a line length between the connecting point and the first driving circuit, and wherein the output signal of the first driving circuit varies according to input signals of the first driving circuit.

2. The semiconductor integrated circuit device according to claim 1, wherein the first driving circuit is precharged in a period while the first clock signal is LOW or HIGH and becomes operative in a period in which the first clock signal is HIGH or LOW.

3. The semiconductor integrated circuit device according to claim 1, wherein the second clock signal is supplied from the first clock signal.

4. The semiconductor integrated circuit device according to claim 1, further including a plurality of the next gate circuits that are connected to the transmission line connected to the first driving circuit, and a plurality of speed increasing circuits being connected to the transmission line at connecting points of the transmission line in accordance with the plurality of next gate circuits.

5. The semiconductor integrated circuit device according to claim 1, further including a plurality of the driving circuits that are controlled by the first clock signal and drive the transmission line.

6. The semiconductor integrated circuit device according to claim 1, wherein the speed increasing circuit operates to increase the speed of change of the transmission line connecting the first circuit to the next gate circuit from LOW to HIGH or from HIGH to LOW.

7. The semiconductor integrated circuit device according to claim 2, wherein each of the first and the second clock signals is supplied from clock signals of the same phase in the semiconductor integrated circuit device.

8. The semiconductor integrated circuit device according to claim 2, further including a plurality of next gate circuits that are connected to the transmission line connected to the first driving circuit, and a plurality of speed increasing circuits is connected to the transmission line at connecting positions of the transmission line in accordance with the plurality of next gate circuits.

9. The semiconductor integrated circuit device according to claim 3, further including a plurality of next gate circuits that are connected to the transmission line connected to the first driving circuit, and a plurality of speed increasing circuits is connected to the transmission line at connecting positions of the transmission line in accordance with the plurality of next gate circuits.

10. The semiconductor integrated circuit device according to claim 2, further including a plurality of the driving circuits that are controlled by the first clock signal and drive the transmission line.

11. The semiconductor integrated circuit device according to claim 3, further including a plurality of the driving circuits that are controlled by the first clock signal and drive the transmission line.

12. The semiconductor integrated circuit device according to claim 4, further including a plurality of the driving circuits that are controlled by the first clock signal and drive the transmission line.

13. The semiconductor integrated circuit device according to claim 2, wherein the speed increasing circuit operates to increase the speed of change of the transmission line connecting the first circuit to the next gate circuit from LOW to HIGH or from HIGH to LOW.

14. The semiconductor integrated circuit device according to claim 3, wherein the speed increasing circuit operates to increase the speed of change of the transmission line connecting the first circuit to the next gate circuit from LOW to HIGH or from HIGH to LOW.

15. The semiconductor integrated circuit device according to claim 4, wherein the speed increasing circuit operates to increase the speed of change of the transmission line connecting the first circuit to the next gate circuit from LOW to HIGH or from HIGH to LOW.

16. The semiconductor integrated circuit device according to claim 5, wherein the speed increasing circuit operates to increase the speed of change of the transmission line connecting the first circuit to the next gate circuit from LOW to HIGH or from HIGH to LOW.

* * * * *